United States Patent
Gimpel et al.

(10) Patent No.: US 10,436,935 B2
(45) Date of Patent: Oct. 8, 2019

(54) OPTOELECTRONIC SENSOR AND METHOD OF DETECTING OBJECTS IN A MONITORED ZONE

(71) Applicant: SICK AG, Waldkirch (DE)

(72) Inventors: Hartmut Gimpel, Waldkirch (DE); Sebastian Tschuch, Waldkirch (DE)

(73) Assignee: SICK AG, Waldkirch (DE)

( * ) Notice: Subject to any disclaimer, the term of this patent is extended or adjusted under 35 U.S.C. 154(b) by 0 days.

(21) Appl. No.: 16/053,928

(22) Filed: Aug. 3, 2018

(65) Prior Publication Data
US 2019/0041545 A1   Feb. 7, 2019

(30) Foreign Application Priority Data

Aug. 4, 2017 (DE) .......................... 10 2017 117 694

(51) Int. Cl.
*G01V 8/12* (2006.01)
*G01S 17/02* (2006.01)
(Continued)

(52) U.S. Cl.
CPC .............. *G01V 8/12* (2013.01); *G01S 7/4815* (2013.01); *G01S 17/026* (2013.01); *G01S 17/42* (2013.01);
(Continued)

(58) Field of Classification Search
CPC ......... G01V 8/12; G01S 7/4815; G01S 17/42; G01S 17/48; G01S 17/026
See application file for complete search history.

(56) References Cited

U.S. PATENT DOCUMENTS

2009/0059201 A1   3/2009   Willner et al.
2013/0266326 A1   10/2013  Joseph et al.
(Continued)

FOREIGN PATENT DOCUMENTS

DE   19514626 A1   10/1996
DE   10156282 A1   6/2003
(Continued)

OTHER PUBLICATIONS

German Office Action dated Jun. 11, 2018 in corresponding German Patent Application No. DE 102017117694.2.

*Primary Examiner* — Roy M Punnoose
(74) *Attorney, Agent, or Firm* — Nath, Goldberg & Meyer; Jerald L. Meyer; Stanley N. Protigal

(57) ABSTRACT

An optoelectronic sensor for detecting objects in a monitored zone is provided that has a light transmitter having a plurality of individual light sources and a transmission optics arranged in front of the light transmitter for transmitting a transmitted light beam that is composed of a plurality of individual light beams of the individual light sources; a light receiver for generating a received signal from the transmitted light beam remitted in the monitored zone and incident on the light receiver; and an evaluation unit for detecting the objects from the received signal. An optical deflection element is arranged between the light transmitter and the transmission optics and has microoptical zones which are associated with the individual light sources and which deflect the individual light beams onto one another such that the cross-sections of the individual light beams together take up a smaller area in a virtual image plane in front of the transmission optics than the individual light sources themselves.

14 Claims, 6 Drawing Sheets

(51) Int. Cl.
*G01S 17/42* (2006.01)
*G01S 17/48* (2006.01)
*G01S 7/481* (2006.01)
*H01L 31/107* (2006.01)
*H01L 31/167* (2006.01)
*H01S 5/00* (2006.01)
*H01S 5/022* (2006.01)
*H01S 5/183* (2006.01)
*H01S 5/42* (2006.01)

(52) U.S. Cl.
CPC ............ *G01S 17/48* (2013.01); *H01L 31/107* (2013.01); *H01L 31/167* (2013.01); *H01S 5/0071* (2013.01); *H01S 5/02252* (2013.01); *H01S 5/183* (2013.01); *H01S 5/423* (2013.01)

(56) References Cited

U.S. PATENT DOCUMENTS

| | | | |
|---|---|---|---|
| 2016/0182891 A1 | 6/2016 | Ko et al. | |
| 2018/0292512 A1* | 10/2018 | Gimpel | G01S 17/42 |
| 2019/0120962 A1* | 4/2019 | Gimpel | G01S 17/10 |

FOREIGN PATENT DOCUMENTS

| | | |
|---|---|---|
| DE | 102007004609 A1 | 8/2007 |
| DE | 102011052802 A1 | 2/2013 |
| EP | 1031471 B1 | 12/2004 |
| EP | 2560366 A2 | 2/2013 |
| WO | 2014/102341 A1 | 7/2014 |

\* cited by examiner

OPTOELECTRONIC SENSOR AND METHOD OF DETECTING OBJECTS IN A MONITORED ZONE

FIELD

The invention relates to an optoelectronic sensor for detecting objects in a monitored zone that has a light transmitter having a plurality of individual light sources and a transmission optics arranged in front of the light transmitter for transmitting a transmitted light beam that is composed of a plurality of individual light beams of the individual light sources; a light receiver for generating a received signal from the transmitted light beam remitted in the monitored zone and incident on the light receiver; and an evaluation unit for detecting the objects from the received signal. The invention further relates to a method of detecting objects in a monitored zone, wherein a transmitted light beam that is composed of a plurality of individual light beams is transmitted by a transmission optics; wherein a received signal is generated from the transmitted light beam remitted in the monitored zone; and wherein the received signal is evaluated to detect the objects.

BACKGROUND AND ENVIRONMENT

Many optoelectronic sensors work in accordance with the scanning principle in which a light beam is transmitted into the monitored zone and the light beam reflected by objects is received again in order then to electronically evaluate the received signal. The time of flight (TOF) is in this respect often measured using a known phase method or pulse method to determine the distance of a scanned object. In a pulse averaging process known, for example, from EP 2 469 296 B1, a plurality of individual pulses are transmitted for a measurement and the received pulses are statistically evaluated. Another possibility for determining distances is triangulation. A light transmitter and a spatially resolving light receiver are here arranged next to one another and the position of the received light spot is evaluated in dependence on the object distance.

To expand the measured zone, the scanning beam can be moved, as is the case in a laser scanner. A light beam generated by a laser there periodically sweeps over the monitored zone with the help of a deflection unit. In addition to the measured distance information, a conclusion is drawn on the angular location of the object from the angular position of the deflection unit and the site of an object in the monitored zone is thus detected in two-dimensional polar coordinates. The scanning movement is achieved by a rotating mirror in many laser scanners. It is, however, also known to instead have the total measurement head with light transmitters and light receivers rotate, such as is described in DE 197 57 849 B4.

LEDs or laser diodes serve as the light source of an optoelectronic sensor. Although only one light beam and thus a single light source is needed with a light scanner, it is also known to use a light beam from an array having a plurality of light sources. One reason can be the desire for a higher optical output power.

In particular VCSELs (vertical cavity surface emitting lasers) frequently no longer have a single light emission surface ("mesa"), but rather a plurality of light emission surfaces arranged in direct proximity. The reason is that the emission angle of light from small light emission surfaces can be monitored better from the manufacturer's side. The individual light emission surface is then admittedly smaller, but a perimeter comprising all the light emission surfaces becomes larger. If the light of such a VCSEL is imaged using a single transmission lens, disadvantageous larger light spots result therefrom in the monitored zone and ultimately on the reception element of the sensor.

This problem cannot be solved by a simple additional lens. FIG. 12 shows an exemplary light transmitter 100 having two individual light sources 102a-b and an associated transmission optics 104. An additional individual lens 106 is arranged between the light transmitter 100 and the transmission optics 104. It generates a smaller real intermediate image 108a-b of the individual light sources 102a-b so that first, as desired, the perimeter about the individual light sources 102a-b has become smaller. Since, however, the etendue is a conserved quantity, the smaller intermediate image 108a-b must necessarily be accompanied by an increased angle of radiation $\alpha_2 > \alpha_1$. No advantage is therefore achieved overall since all the light is no longer incident on the common transmission optics 104.

A further conceivable approach is to associate a microlens field with the VCSEL that has an at least partly separate light path for each light emission surface. A real intermediate image of an associated light emission surface is in particular generated by a respective once microlens.

FIG. 13 shows a first example. The two individual light sources 102a-b of the light transmitter 100 here each have microlenses 106a-b associated with them. The common transmission optics 104 arranged downstream is no longer shown here. Each individual light source 102a-b is imaged onto the same intermediate image 108a-b by the associated microlens 106a-b, with the overlap not having to be perfect and with the common intermediate image 108a-b optionally being larger than an individual light source 102a-b. It can admittedly be achieved in this respect that the angle of divergence of the individual light sources remains constant, but the angle of divergence of the total light beam is further enlarged by the tilting of the main beams. An additional disadvantage of the approach using real intermediate images can be found in the required high refractive power of the microlenses that results in aberrations and thus in enlarged, blurred real intermediate images due to a large curvature of the lens surfaces.

FIG. 14 shows a further example. Unlike in FIG. 13, the intermediate images 108a-b are here separate and are not disposed above one another, but preferably in very close proximity. The disadvantage of the enlarged angle of divergence remains.

The approach using microlenses only works more or less well for as long as the individual light sources 102a-b are comparatively small and are far apart from one another. In many cases, however, the light emission surfaces are large in comparison with their mutual distances in a VCSEL. The microlenses 106a-b now have to approach very close to the respective emission surface so that they are selectively only illuminated by their light. However, from such a small distance, the light emission surface has a large spatial angular expansion. The microlens 106a-b therefore has to cover a respective large image field. An individual lens is only suitable for this purpose with limitations; the images therefore become considerably blurred so that the desired effect of a decrease in size is lost again.

DE 101 56 282 A2 discloses a laser scanner that uses a laser matrix as a light source. Its individual lasers, however, each transmit their own scanning beam to obtain a distance image having so many individual distance points as the laser matrix has individual lasers.

DE 10 2011 052 802 A1 discloses a 3D camera having an illumination unit that has a plurality of individual emitters having respective microoptics in the form of prisms and lenses. A structured illumination pattern is thus generated, wherein a respective individual emitter contributes a light spot that is projected onto a specific location by means of the associated microoptics to obtain a pseudo-random pattern overall. However, it is not the aim here to scan an object with a small light spot, but conversely to illuminate the total detection zone.

A further optical system is known from WO 2014/102341 A1 that generates a structured light pattern, wherein the combination of microprisms and microlenses can again be used.

US 2013/0266326 A1 discloses microlenses for a multi-beam VSCEL array. The problem discussed with reference to FIGS. 13 and 14 is, however, not discussed or even solved here.

It is therefore the object of the invention to improve a scanning sensor of the category having a light transmitter composed of a plurality of individual light sources.

SUMMARY

This object is satisfied by an optoelectronic sensor and by a method of detecting objects in a monitored zone in accordance with the respective independent claim. A transmitted light beam from the respective individual light beams is transmitted using a light transmitter that has a plurality of individual light sources. The light remitted in the monitored zone is received again and a received signal is generated therefrom and is then evaluated.

The invention starts from the basic idea of using a non-imaging microoptics for an effective closing up or densifying of the individual light sources. An optical deflection element is provided for this purpose having non-imaging microoptical zones associated with the individual light sources. They direct the individual light beams inwardly onto one another. Since the microoptical zones are in particular non-imaging, a real intermediate image is dispensed with; a virtual image is sufficient since, as explained in the introduction, neither an additional individual lens nor microlenses would be able to achieve the desired result. The microoptical zones deflect the individual light beam without disadvantageously increasing the angle of divergence between the microoptics and the transmission lens. The individual light beams now appear to originate virtually from a smaller area than originally physically on the light transmitter. The light transmitter acts as a light transmitter having a more compact arrangement of the individual light sources in the virtual image plane. This smaller area is measured, for example, at a perimeter around the individual light beams or the individual light sources. The individual light beams themselves are only deflected and their cross-sections do not therefore become smaller, but with a certain shape distortion including a reduction in size not being precluded.

The invention has the advantage that the cross-section of the transmitted light beam that is transmitted and thus the transmitted light spot in the monitored zone and the received light spot on the light receiver are reduced in size. The resolution is thus improved and there are fewer light losses on the light receiver through temperature, tolerances, and the like. The transmitted light beam of a plurality of individual light beams is transformed such that it is virtually generated from a smaller spatial zone without disadvantageously increasing the angular distribution in so doing. Since an imaging is dispensed with, a large lens curvature is not required and the aberrations named in the introduction are avoided or at least considerably reduced. The optical deflection element can be inexpensively manufactured as a glass blank, as an injection molded plastic part, or using other known manufacturing processes for microoptics.

The light transmitter preferably has a VCSEL having a plurality of light emission surfaces (mesa) as individual light sources. As explained in the introduction, there are advantages in a technical manufacturing aspect to image a VCSEL not with one light emission surface, but with a plurality thereof. There is therefore a particular need for the optical deflection element in accordance with the invention to nevertheless obtain effectively small light spots. Inexpensive VCSELs having production-reliable, small angles of radiation through a plurality of smaller light emission surfaces can thus also be used in sensors, in particular in light sensors and laser scanners, having a fine scanning beam. Alternatively, other multiple lasers or multiple LEDs are also possible in a common integrated matrix arrangement or also as separated individual light sources.

At least some of the individual light sources are preferably arranged on a circle. This is a simple and frequently used arrangement, in particular for some light emission surfaces, that is, for example, at most ten light emission surfaces, of a VCSEL. The optical deflection element here provides that the circle is constricted and accordingly has a smaller radius in the virtual image plane. A plurality of concentric circles are likewise conceivable, with the optical deflection element then having to be shaped in a somewhat more complex and/or expensive manner.

The portion of the individual light sources preferably forms a regular n-gon. The individual light sources are then not only disposed on a circle, but rather also at equal intervals from one another. Such regular arrangements are particularly advantageous since they are easier to handle and result in a more uniform light distribution in the transmitted light beam.

Individual light sources that are not arranged on the circle are preferably arranged at the center of the circle. This center also corresponds to the center of gravity of the regular n-gon if some of the individual light sources are arranged in this manner. This produces a regular arrangement of individual light sources utilizing the surface. There are preferably no further individual light sources beyond those arranged on the circle and at the center.

The microoptical zones preferably have light waveguides. This requires a somewhat more complex manufacture of the optical deflection element. The exit location and exit angle of the individual light beam can be selected practically as individually as desired using light guides and a suitable arrangement of virtual individual light sources can thus be found overall.

The microoptical zones preferably have tilted planar surfaces with respect to the optical axis of the associated individual light source. The microoptical zones thus act as prisms that displace the light of the associated individual light source inwardly in the desired manner.

The planar surfaces preferably form the side surfaces of a pyramid or of a truncated pyramid. The base surface of the pyramid corresponds to the arrangement of the individual light sources, that is in particular to a regular n-gon. The individual light sources are, however, here preferably not seated in the corners of the base surface. If a projection of the side surfaces onto the base surface is looked at, the individual light sources are thus disposed at least more or less centrally in this respect so that the whole individual light bundle is incident on the side surface and not on any edges. The n-gon of the individual light sources is therefore rotated, in particular by 360°/2n, with respect to the base surface and is additionally reduced in size. The center of the pyramid is optically only relevant when there is at least one further central individual light source in addition to the n-gon. Its individual light beam does not have to be deflected since it is already disposed in the transmitted light beam. The pyramid can therefore be simply cut off in a planar manner so that a truncated pyramid is produced. If there are no central individual light sources, the tip of the pyramid can be designed solely according to technical manufacturing aspects, that is likewise cut off, but also rounded or the like.

The deflection element preferably has a hollow cone or a hollow truncated cone whose jacket surface forms microoptical zones. This is so-to-say the continuous version of a pyramid that is rotationally symmetrical overall and not only for some fixed angles. It could be considered a convex-concave axicon optically. A hollow cone is less expensive depending on the material and on the manufacturing process and does not have to be adjusted in the peripheral direction. In a hollow cone, the respective individual light source is actually a side surface in a similar manner as associated in a pyramid. The curvature of this side surface in the peripheral direction is not particularly large since the cross-section of the individual light beam only corresponds to a small angular range of the hollow cone. The astigmatism thereby produced is acceptable in many cases. The statements with respect to the tip of the pyramid also apply accordingly to a hollow cone that is therefore in particular formed as a hollow truncated cone or with a rounded tip.

The evaluation unit is preferably configured to determine a distance of the remitting or scanned object from a time of flight of the transmitted and re-received transmitted light beam or by means of triangulation. A distance-measuring sensor or scanner is thus produced. The time of flight process is known per se and a pulse process, phase process, or pulse averaging process can be used, for example. Triangulation is likewise known per se. So-called background masking scanners whose detection signal only binarily determines the presence of an object, but only within a specific distance range by means of triangulation evaluation form a special case.

The sensor is preferably configured as a laser scanner and has a movable deflection unit for this purpose to periodically deflect the transmitted light beam in the monitored zone. The monitored zone is thereby expanded to a plane with respect to a single-beam sensor or scanner or, when the deflection unit is movable in two axes, even to a three-dimensional spatial zone. The deflection unit can be a pivoting mirror or a rotating mirror, but equally a rotating or vibrating scanning head in which a plurality of measurement modules can also be arranged in the same and/or offset angles to simultaneously detect a plurality of measured values from a larger monitored zone.

The method in accordance with the invention can be further developed in a similar manner and shows similar advantages in so doing. Such advantageous features are described in an exemplary, but not exclusive manner in the subordinate claims dependent on the independent claims.

BRIEF DESCRIPTION OF THE DRAWINGS

The invention will be explained in more detail in the following also with respect to further features and advantages by way of example with reference to embodiments and to the enclosed drawing. The Figures of the drawing show in.

DETAILED DESCRIPTION

Figure 1:
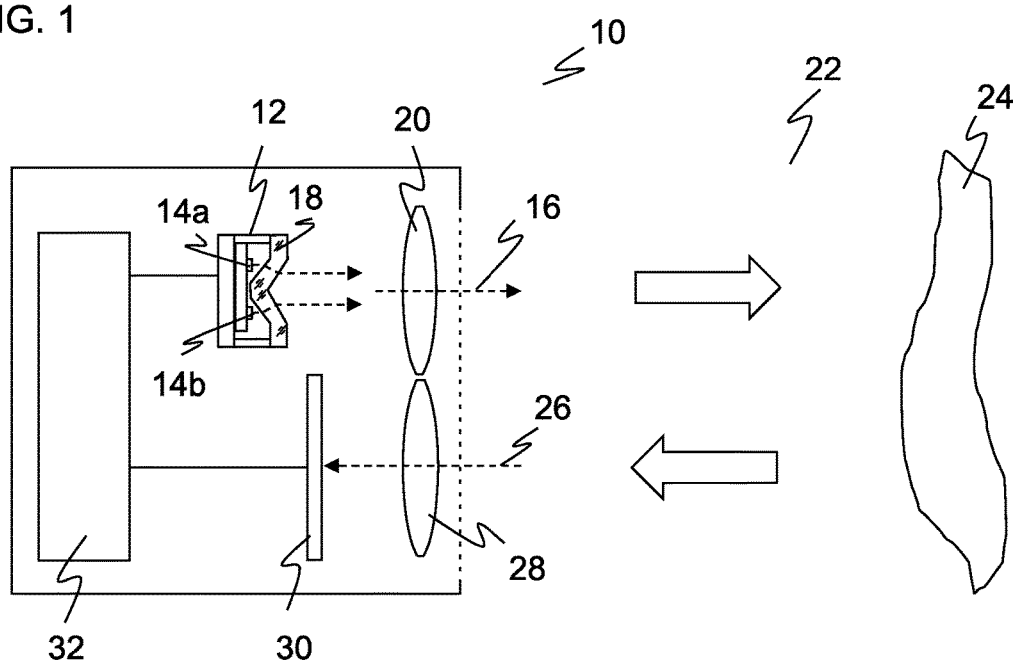
FIG. 1 a schematic sectional representation of an optoelectronic sensor.

FIG. 1 shows a schematic sectional representation of an optoelectronic sensor 10. A light transmitter 12 has a plurality of individual light sources 14a-b; two individual light sources 14a-b in the example shown. Their individual light beams together form a transmitted light beam 16 whose cross-section is first reduced with the aid of an optical deflection element 18 and that is then transmitted into a monitored zone 22 via a common transmission optics 20, preferably an individual lens.

The light transmitter 12 is preferably a VCSEL and the individual light sources 14a-b are then formed by the light emission surfaces (mesa). Alternatively, other laser light sources or LEDs are conceivable. The combination of the light transmitter 12 and the optical deflection element 18 as a common component in FIG. 1 is advantageous, but the invention is not restricted thereto. The optical effect and possible embodiments of the optical deflection element 18 will be explained in more detail below with reference to FIGS. 2 to 11.

If the transmitted light beam 16 is incident on an object 24 in the monitored zone 22, a portion of the light returns to the sensor 10 as a remitted transmitted light beam 26 and is there bundled by a reception optics 28 onto a light receiver 30 that is, for example, configured as a photodiode, as an APD (avalanche photodiode), as a SPAD (single photon avalanche photodiode), or as a multiple arrangement of such reception elements.

An evaluation unit 32 controls the light transmitter 12 and evaluates the reception signal of the light receiver 30 to determine whether the transmitted light beam 16 has detected an object 24. In a preferred embodiment, the distance from the object 24 is also determined. The time of flight process used here can be a single pulse process or a multiple pule process, but can also be a phase process and is known per se. A triangulation process is also conceivable.

FIG. 1 shows an exemplary biaxial construction of the sensor 10. The invention is not restricted thereto, but covers all scanning optoelectronic sensors. A coaxial arrangement of the light transmitter 12 and of the light receiver 30 by a light transmitter 12 arranged in front of the light receiver or by means of a beam splitter is in particular conceivable. In addition, the sensor 10 can be a laser scanner instead of a single-beam scanner in that the transmitted light bundle is periodically deflected by a movable mirror or in that a movable optics head is provided in which the light transmitter 12 and/or the light receiver 30 are also moved.

As explained in the introduction, the cross-section of the transmitted light beam 16 and thus the size of the light spot on the object 24 and of the received light spot on the light receiver 30 would be considerably increased solely after imaging the transmission optics 20 by the plurality of individual light sources 14a-b in comparison with a single light source. The optical deflection element 18 serves also to achieve a fine transmitted light beam 16 having a small cross-section and thus small light spots for a light transmitter 12 having a plurality of individual light sources 14a-b. This effect of the optical deflection element 18 will now be looked at in more detail with reference to a number of embodiments.

Figure 2:
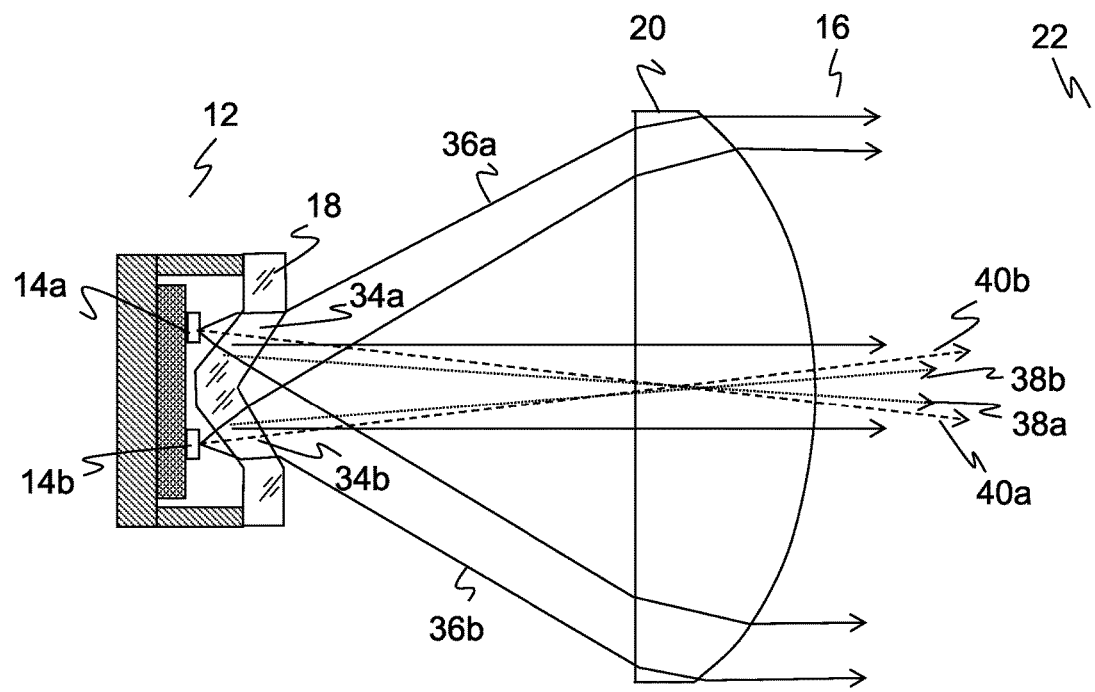
FIG. 2 a sectional representation of an embodiment of a light transmitter with an optical deflection element and transmission optics arranged downstream.

FIG. 2 shows the light transmitter 12 together with the optical deflection element 18 in accordance with FIG. 1 in an enlarged representation. The optical deflection element 18 is overall roughly a planar plate that, however, has a microoptics 34a-b imprinted on both sides, here in the form of two planar surfaces for each individual light source 14a-b which are in parallel with one another and which are tilted with respect to the optical axis of the light transmitter 12. The microoptics 34-b acts on the individual light bundles 36a-b of the individual light sources 14a-b like a double prism. The individual light beams 36a-b appear by its deflection to originate from individual light sources 14a-b moved closer together and thus overall from a smaller area of the light transmitter 12. For illustration, the main beams 38a-b of the individual light beams 36a-b are drawn that include a smaller angle due to the optical deflection element 18 than in main beams 40a-b shown for comparison for the case without an optical deflection element 18.

Figure 3:
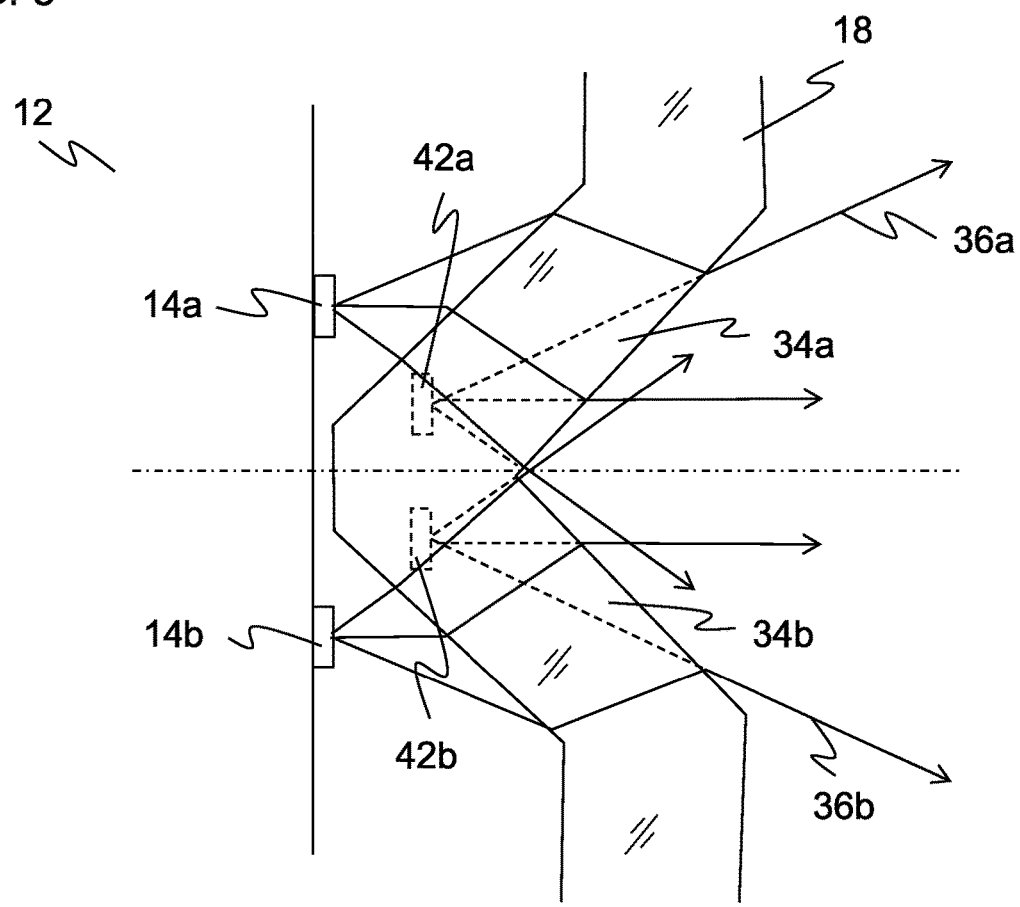
FIG. 3 an enlarged representation of the deflection element in accordance with FIG. 2 and of the optical path.

FIG. 3 shows a view of the optical path at the optical deflection element 18 increased in size again. The individual light beams 36a-b are deflected inwardly by the microoptics 34a-b. There are thereby two virtual images 42a-b of the individual light sources 14a-b that are moved closer together and have a smaller distance from one another and thus take up a smaller area than the individual light sources 14a-b. The radius of the individual light sources 14a-b and of the virtual images 42a-b are here approximately the same per se since the microoptics 34a-b only deflect and do not image. The radius of a perimeter about the individual light sources 14a-b is in contrast substantially larger than that of a perimeter around the virtual images 42a-b.

Figure 4:
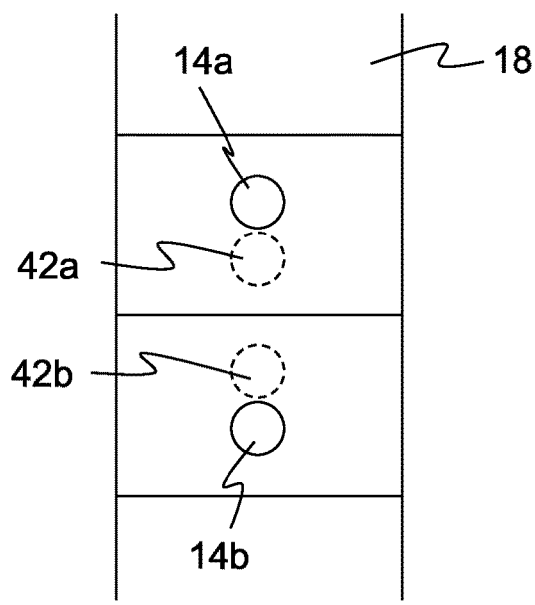
FIG. 4 a plan view of an optical deflection element that virtually moves two individual light sources closer together or densifies them.

FIG. 4 illustrates the virtual images 42a-b moved closer together again in a plan view of the optical deflection element 18. As already explained, the size of the individual light sources 14a-b and of their respective virtual images 42a-b is approximately the same, with certain deformations in shape and size being conceivable. The virtual images 42a-b are, however, considerably closer to one another so that they take up a smaller are overall or are enclosed by a smaller perimeter.

Figure 5:
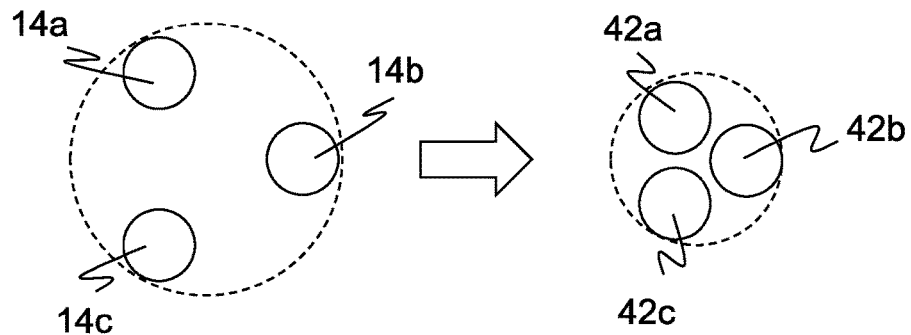
FIG. 5 a schematic representation of the virtual moving closer together or densifying of three individual light sources by a further optical deflection element.
Figure 6:
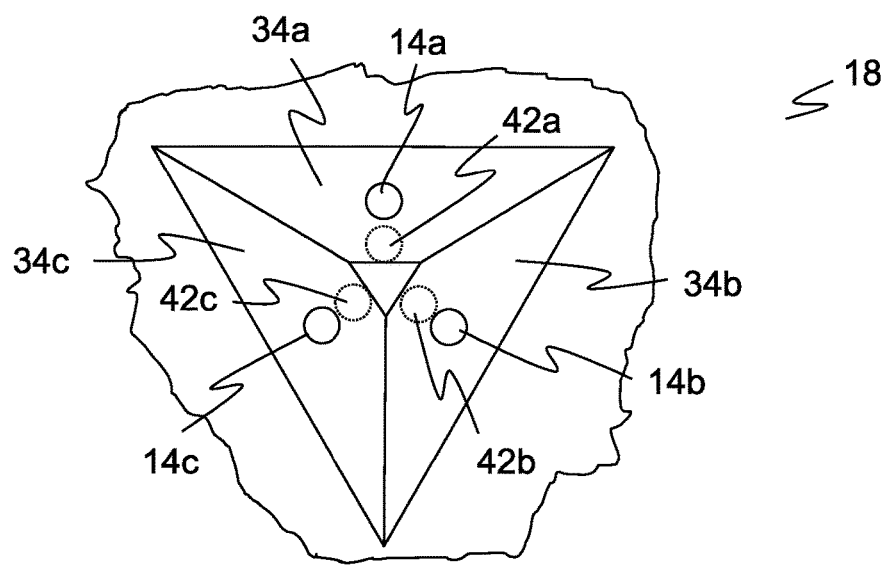
FIG. 6 a plan view of an optical deflection element for three individual light sources.
Figure 7:
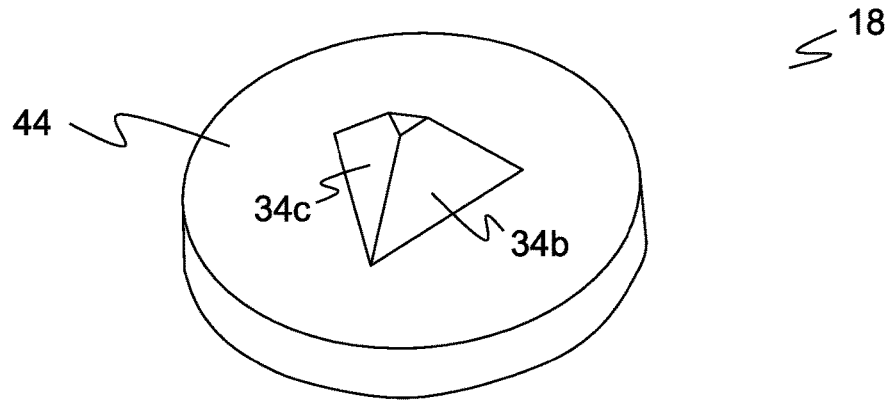
FIG. 7 a three-dimensional representation of an embodiment of an optical deflection element for three individual light sources.
Figure 8:
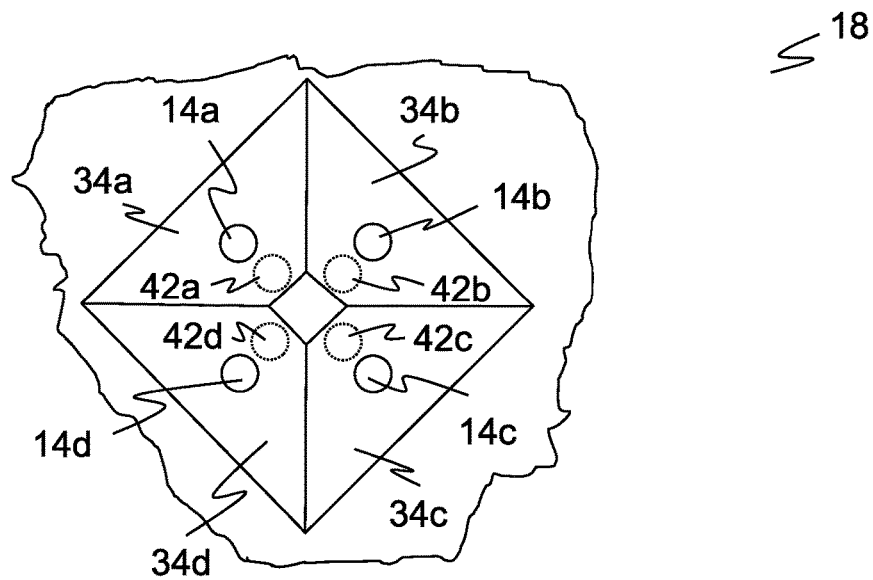
FIG. 8 a plan view of an optical deflection element for four individual light sources.
Figure 9:
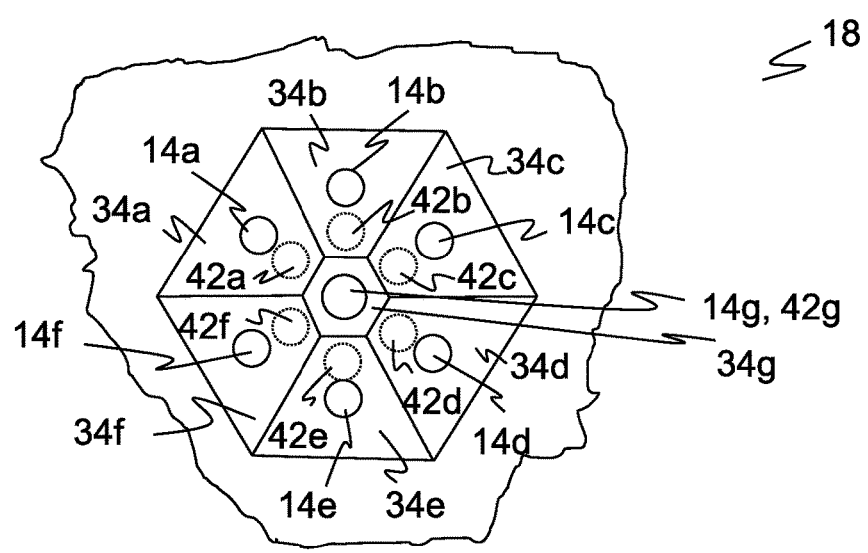
FIG. 9 a plan view of an optical deflection element for seven individual light sources.

The light transmitter 12 only has two individual light sources 14a-b in the previous examples. The invention is not restricted to only two individual light sources 14a-b. The representations can first alternatively be understood as sectional representations through more than two individual light sources 14a-b arranged in annular form. FIGS. 5 to 7 furthermore show an embodiment for three individual light sources 14a-c; FIG. 8 shows an embodiment for four individual light sources 14a-d, and FIG. 9 shows an embodiment for seven individual light sources 14a-g. Optical deflection elements 18 for light transmitters 12 can accordingly be designed with a different number of individual light sources.

FIG. 5 illustrates the moving closer of three individual light sources 14a-c to three virtual images 42a-c. As already discussed with respect to FIG. 4, the virtual images 42a-c are themselves practically exactly as large as the individual light sources 14a-c themselves, but over a considerably smaller area within a smaller perimeter.

FIG. 6 shows a design of the optical deflection element 18 possible for this in a plan view. The microoptical zones 34a-c form the side surfaces of a triangular pyramid. This pyramid is hollow since the microoptical zones 34a-c are planar surfaces analog to FIGS. 2 to 4. The tip of the pyramid is not optically relevant and is here cut off for technical manufacturing reasons.

FIG. 7 shows a corresponding optical deflection element 18 in a three-dimensional view. The pyramid or the truncated pyramid having the microoptical zones is imprinted into a planar surface 44 at both sides for better handling. The view can equally be understood as a view from above of the tip of the pyramid and as a view from below into the interior hollow space of the pyramid.

A substantial reduction in size of the perimeter to, for example, 60% is achieved using an optical deflection element 18 designed in this manner. The light losses are small at 10-15%, in addition, they are mainly Fresnel reflections that could be further reduced by an anti-reflection coating.

FIG. 8 is a view corresponding to FIG. 6, but for four individual light sources 14a-d. FIG. 9 shows a further example for seven individual light sources 14a-g. One of the individual light sources 14g is arranged centrally here and the associated central zone of the optical deflection element 18 is here open or is a perpendicular planar plate since the centrally transmitted light is preferably not deflected. It is advantageous for the base surface of the pyramid to be a regular n-gon to achieve a uniform light distribution and deflection. The generalization to a different n can be seen from the examples. A plurality of concentric rings of individual light sources can also be formed here; the optical deflection element 18 would then preferably be formed from a plurality of stacked pyramids having side walls of different steepness. Other arrangements of the individual light sources are also possible with which then corresponding tilted planar surfaces are preferably associated, with different geometrical bodies then being produced.

It is also conceivable to allow curvatures instated of tilted planar surfaces even though this has the consequence of certain optical distortions. An example for this is the design of the optical deflection element 18 with a hollow cone instead of with a pyramid. The cutaway view or the detail view would be identical to FIGS. 1 to 4. The optical deflection element 18 is, however, then rotationally symmetrical. The curvature in the peripheral direction introduces a small astigmatism that can, however, be neglected or at least tolerated. The correspondingly shaped optical deflection element 18 can be called a convex-concave axicon. It offers the advantage that it can be produced more simply, more precisely, and less expensively with its inner and outer conical jacket surface depending on the manufacturing process. In addition, it is not restricted to a certain number of individual light sources, but can rather deal with any desired number of individual light sources arranged in a ring. At least one further centrally arranged individual light source can be taken into account by a truncated cone. A plurality of concentric rings can likewise be deflected by the cone, even better by stacked truncated cones of different gradients.

Figure 10:
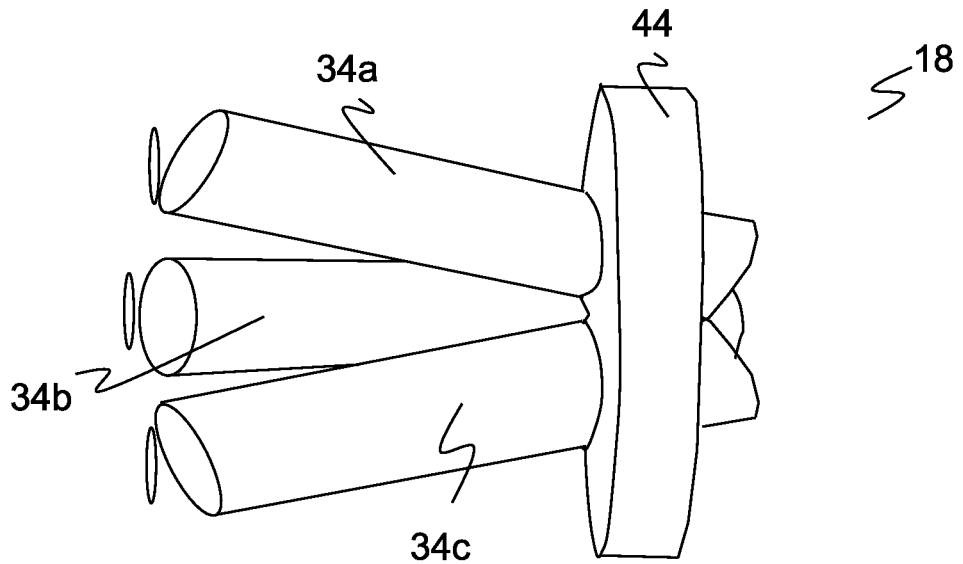
FIG. 10 a three-dimensional view of a further optical deflection element with light guides.

FIG. 10 shows a further embodiment of the optical deflection element 18. The microoptical zones 34a-c are here configured as light guides having suitably tilted entry and exit surfaces. The number of three light guides for three individual light sources is purely by way of example. In general, one or two of the refractions at the two prism surfaces of the embodiments in accordance with FIGS. 1 to 9 can be replaced with reflections at mirror-coated surfaces or with a total reflection. The light guides can accordingly not only be solid bodies of a transparent material, but also hollow light guides having internal mirror coatings.

Figure 11:
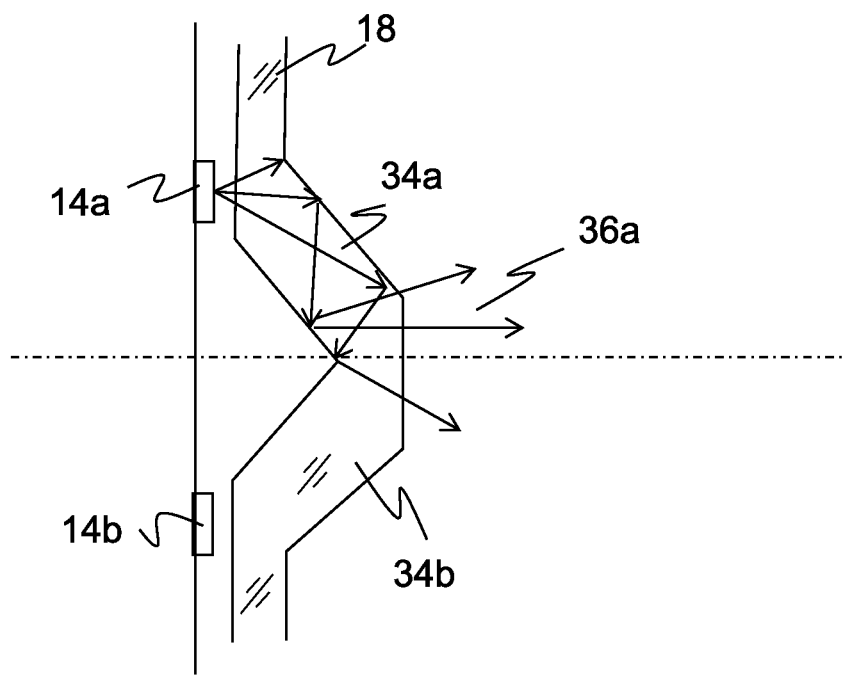
FIG. 11 a sectional representation of an optical deflection element with a light guide or total reflection.
Figure 12:
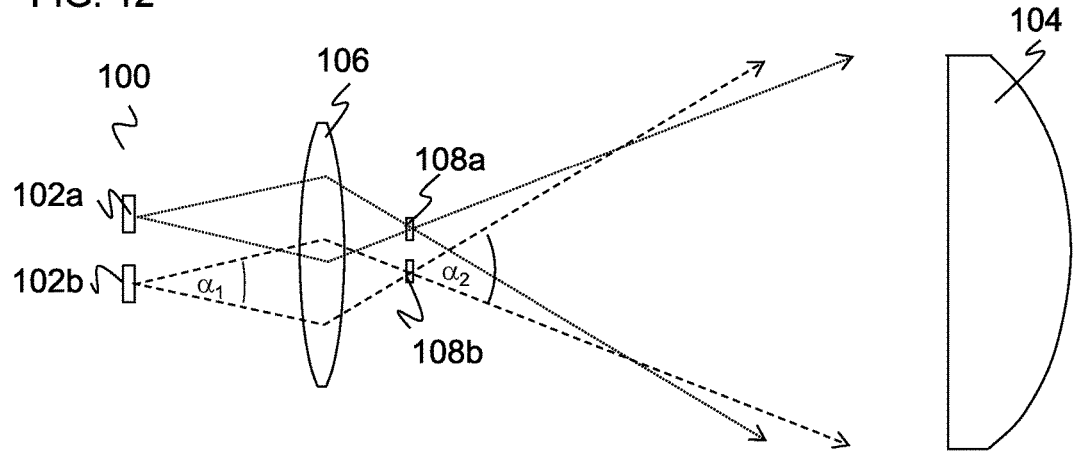
FIG. 12 a sectional representation for explaining why an individual additional lens is not suitable.
Figure 13:
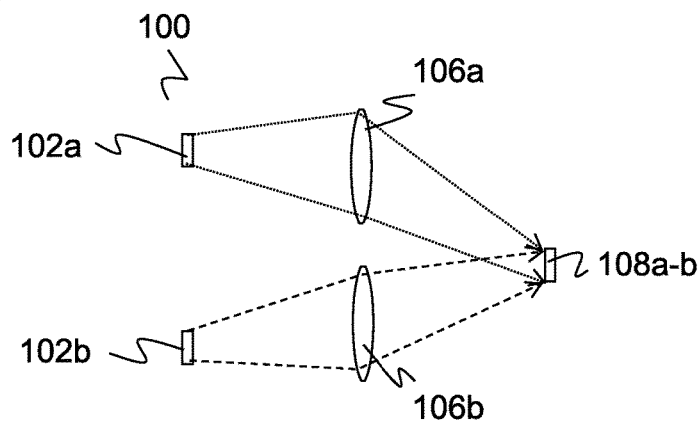
FIG. 13 a sectional representation of a light transmitter with microlenses that image individual light sources on a common real intermediate image.
Figure 14:
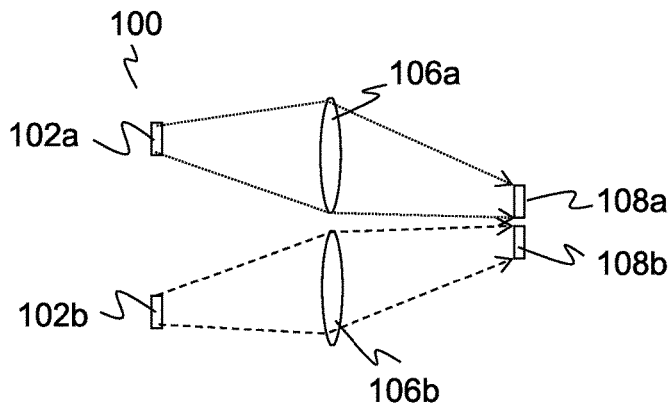
FIG. 14 a sectional representation like FIG. 13, but with separate real intermediate images.

FIG. 11 illustrates the idea of folding the optical path by means of total reflection with a sectional representation of a further embodiment of the optical deflection element 18. This is also called a light guide here because it is the same optical principle of action.

The explained embodiments relate to the light transmitter 12 whose light spot generated by a plurality of individual light sources is reduced in size by the optical deflection element 18. The optical deflection element could, however, also be used at the reception side, for instance with a spatially resolving light receiver 30, in particular with a plurality of light reception elements such as a photodiode array, an APD array or a SPAD array.

The invention claimed is:

1. An optoelectronic sensor for detecting objects in a monitored zone, the optoelectronic sensor comprising:
   a light transmitter having a plurality of individual light sources and a transmission optics arranged in front of the light transmitter for transmitting a transmitted light beam that is composed of a plurality of individual light beams of the individual light sources;
   a light receiver for generating a received signal from the transmitted light beam remitted in the monitored zone and incident on the light receiver;
   an evaluation unit for detecting the objects from the received signal, and
   an optical deflection element that is arranged between the light transmitter and the transmission optics and that has microoptical zones, the microoptical zones being associated with the individual light sources and the microoptical zones deflecting the individual light beams onto one another such that the cross-sections of the individual light beams together take up a smaller area in a virtual image plane in front of the transmission optics than the individual light sources themselves.

2. The sensor in accordance with claim 1, wherein the microoptical zones are non-imaging microoptical zones.

3. The sensor in accordance with claim 1,
   wherein the light transmitter has a VCSEL having a plurality of light emission surfaces as individual light sources.

4. The sensor in accordance with claim 1,
   wherein at least a portion of the individual light sources are arranged on a circle.

5. The sensor in accordance with claim 4,
   wherein the portion of the individual light sources forms a regular n-gon.

6. The sensor in accordance with claim 4,
   wherein individual light sources that are not arranged on the circle are arranged at the center of the circle.

7. The sensor in accordance with claim 1,
   wherein the microoptical zones have light waveguides.

8. The sensor in accordance with claim 1,
   wherein the microoptical zones have planar surfaces tilted with respect to the optical axis of the associated individual light source.

9. The sensor in accordance with claim 8,
   wherein the planar surfaces form the side surfaces of a pyramid or of a truncated pyramid.

10. The sensor in accordance with claim 1,
    wherein the optical deflection element has a hollow cone or a hollow truncated cone whose jacket surface forms microoptical zones.

11. The sensor in accordance with claim 1,
    wherein the evaluation unit is configured to determine a distance of the remitted object from a time of flight of the transmitted light beams transmitted and received again or by means of triangulation.

12. The sensor in accordance with claim 1,
    that is configured as a laser scanner and that has a movable deflection unit to periodically deflect the transmitted light beam in the monitored zone.

13. A method of detecting objects in a monitored zone, the method comprising the steps of:
    transmitting a transmitted light beam that is composed of a plurality of individual light beams by a transmission optics;
    generating a received signal from the transmitted light beam remitted in the monitored zone;
    deflecting the individual light beams toward one another with the aid of microoptical zones before the entry into the transmission optics such that the cross-sections of the individual light beams together take up a smaller area in a virtual image plane in front of the transmission optics than during their generation and
    evaluating the received signal to detect the objects.

14. The method according to claim 13,
    wherein the microoptical zones are non-imaging microoptical zones.

* * * * *